(12) United States Patent
Youssef et al.

(10) Patent No.: US 9,035,697 B2
(45) Date of Patent: May 19, 2015

(54) SPLIT AMPLIFIERS WITH IMPROVED LINEARITY

(71) Applicant: QUALCOMM Incorporated, San Diego, CA (US)

(72) Inventors: Ahmed A Youssef, San Diego, CA (US); Li-Chung Chang, Irvine, CA (US)

(73) Assignee: Qualcomm Incorporated, San Diego, CA (US)

( * ) Notice: Subject to any disclaimer, the term of this patent is extended or adjusted under 35 U.S.C. 154(b) by 130 days.

(21) Appl. No.: 13/840,317

(22) Filed: Mar. 15, 2013

(65) Prior Publication Data
US 2014/0266461 A1 Sep. 18, 2014

(51) Int. Cl.
| H03F 1/14 | (2006.01) |
| H03F 1/22 | (2006.01) |
| H03F 3/68 | (2006.01) |
| H03F 3/193 | (2006.01) |
| H03F 3/24 | (2006.01) |
| H03F 1/32 | (2006.01) |
| H03F 1/56 | (2006.01) |
| H03F 3/21 | (2006.01) |
| H03F 3/72 | (2006.01) |

(52) U.S. Cl.
CPC .................. *H03F 3/68* (2013.01); *H03F 3/193* (2013.01); *H03F 3/245* (2013.01); *H03F 1/223* (2013.01); *H03F 1/3205* (2013.01); *H03F 1/56* (2013.01); *H03F 3/211* (2013.01); *H03F 3/72* (2013.01); *H03F 2200/489* (2013.01); *H03F 2200/492* (2013.01); *H03F 2200/541* (2013.01)

(58) Field of Classification Search
CPC ............ H03F 1/22; H03F 1/223; H03F 1/226
USPC ............................................ 330/51, 295, 311
See application file for complete search history.

(56) References Cited

U.S. PATENT DOCUMENTS

| 7,795,968 | B1 * | 9/2010 | Li et al. .......................... 330/129 |
| 7,834,698 | B2 | 11/2010 | Sengupta et al. |
| 7,902,925 | B2 | 3/2011 | Kim et al. |
| 8,035,447 | B2 | 10/2011 | Liu et al. |
| 8,350,738 | B2 | 1/2013 | Sanduleanu et al. |
| 2006/0091962 | A1 | 5/2006 | Kim et al. |
| 2009/0258624 | A1 | 10/2009 | Gudem et al. |
| 2011/0018635 | A1 | 1/2011 | Tasic et al. |

FOREIGN PATENT DOCUMENTS

WO 0195485 A2 12/2001

OTHER PUBLICATIONS

Che-Sheng Chen et al: "A 2.5GHz 90nm CMOS Triple Gain Mode LNA for WiMAX Applications" Signals, Systems and Electronics, 2007. ISSSE '07. International Symposium on, IEEE, PI, Jul. 1, 2007, pp. 367-369, XP031129290 ISBN: 978-1-4244-1448-2 p. 367, left-hand column, line 15-p. 368, right-hand column, line 11; figures 2-4.
International Search Report and Written Opinion—PCT/US2014/022976—ISA/EPO—Jun. 15, 2014.

* cited by examiner

*Primary Examiner* — Steven J Mottola
(74) *Attorney, Agent, or Firm* — Smith Risley Tempel Santos LLC

(57) ABSTRACT

Split amplifiers with configurable gain and linearization circuitry are disclosed. In an exemplary design, an apparatus includes first and second amplifier circuits and a linearization circuit, which may be part of an amplifier. The first and second amplifier circuits are coupled in parallel and to an amplifier input. The linearization circuit is also coupled to the amplifier input. The first and second amplifier circuits are enabled in a high-gain mode. One of the first and second amplifier circuits is enabled in a low-gain mode. The linearization circuit is enabled in the second mode and disabled in the first mode. The amplifier is split into multiple sections. Each section includes an amplifier circuit and is a fraction of the amplifier. High linearly may be obtained using one amplifier circuit and the linearization circuit in the low-gain mode.

20 Claims, 10 Drawing Sheets

US 9,035,697 B2

SPLIT AMPLIFIERS WITH IMPROVED LINEARITY

BACKGROUND

I. Field

The present disclosure relates generally to electronics, and more specifically to amplifiers.

II. Background

A wireless device (e.g., a cellular phone or a smartphone) in a wireless communication system may transmit and receive data for two-way communication. The wireless device may include a transmitter for data transmission and a receiver for data reception. For data transmission, the transmitter may modulate a local oscillator (LO) signal with data to obtain a modulated signal, amplify the modulated signal to obtain an output radio frequency (RF) signal having the proper transmit power level, and transmit the output RF signal via an antenna to a base station. For data reception, the receiver may obtain a received RF signal via the antenna and may amplify and process the received RF signal to recover data sent by the base station.

A wireless device may include amplifiers of different types for different purposes. For example, a wireless device may include a low noise amplifier (LNA) in a receiver, a power amplifier (PA) in a transmitter, and a variable gain amplifier (VGA) in the receiver and/or transmitter. An amplifier may need to meet various requirements related to gain, linearity, etc. An amplifier having configurable gain and high linearity is highly desirable.

DETAILED DESCRIPTION

The detailed description set forth below is intended as a description of exemplary designs of the present disclosure and is not intended to represent the only designs in which the present disclosure can be practiced. The term "exemplary" is used herein to mean "serving as an example, instance, or illustration." Any design described herein as "exemplary" is not necessarily to be construed as preferred or advantageous over other designs. The detailed description includes specific details for the purpose of providing a thorough understanding of the exemplary designs of the present disclosure. It will be apparent to those skilled in the art that the exemplary designs described herein may be practiced without these specific details. In some instances, well-known structures and devices are shown in block diagram form in order to avoid obscuring the novelty of the exemplary designs presented herein.

Split amplifiers with configurable gain and linearization circuitry are disclosed herein. A split amplifier is an amplifier comprising multiple amplifier circuits and a linearization circuit. One or more amplifier circuits may be enabled to obtain a desired gain for the split amplifier. The linearization circuit may be enabled or disabled to obtain a desired linearity for the split amplifier. A split amplifier may be viewed as being split into multiple amplifier circuits. A split amplifier may be used for various electronic devices such as wireless communication devices.

Figure 1:
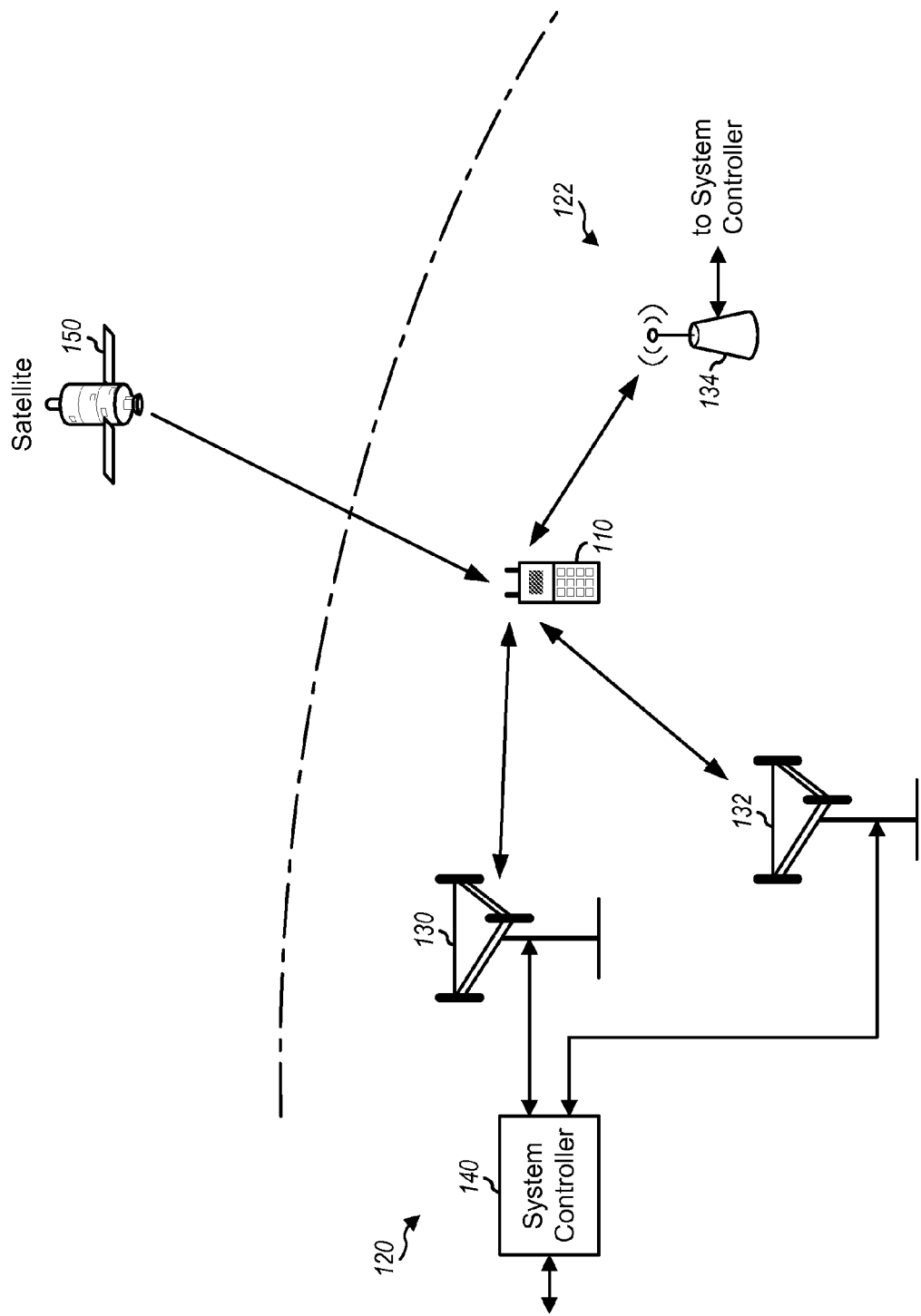
FIG. 1 shows a wireless device communicating with wireless systems.

FIG. 1 shows a wireless device 110 communicating with wireless communication systems 120 and 122. Each wireless system may be a Long Term Evolution (LTE) system, a Code Division Multiple Access (CDMA) system, a Global System for Mobile Communications (GSM) system, a wireless local area network (WLAN) system, or some other wireless system. A CDMA system may implement Wideband CDMA (WCDMA), CDMA 1X, Time Division Synchronous CDMA (TD-SCDMA), or some other version of CDMA. For simplicity, FIG. 1 shows wireless system 120 including two base stations 130 and 132 and one system controller 140, and wireless system 122 including one base station 134. In general, a wireless system may include any number of base stations and any set of network entities. A base station may also be referred to as a Node B, an evolved Node B (eNB), an access point, etc.

Wireless device 110 may also be referred to as a user equipment (UE), a mobile station, a terminal, an access terminal, a subscriber unit, a station, etc. Wireless device 110 may be a cellular phone, a smartphone, a tablet, a wireless modem, a personal digital assistant (PDA), a handheld device, a laptop computer, a smartbook, a netbook, a cordless phone, a wireless local loop (WLL) station, a Bluetooth device, etc. Wireless device 110 may communicate with wireless system 120 and/or 122. Wireless device 110 may also receive signals from broadcast stations, signals from satellites (e.g., a satellite 150) in one or more global navigation satellite systems (GNSS), etc. Wireless device 110 may support one or more radio technologies for wireless communication such as LTE, WCDMA, CDMA 1x, TD-SCDMA, GSM, 802.11, etc.

Figure 2:
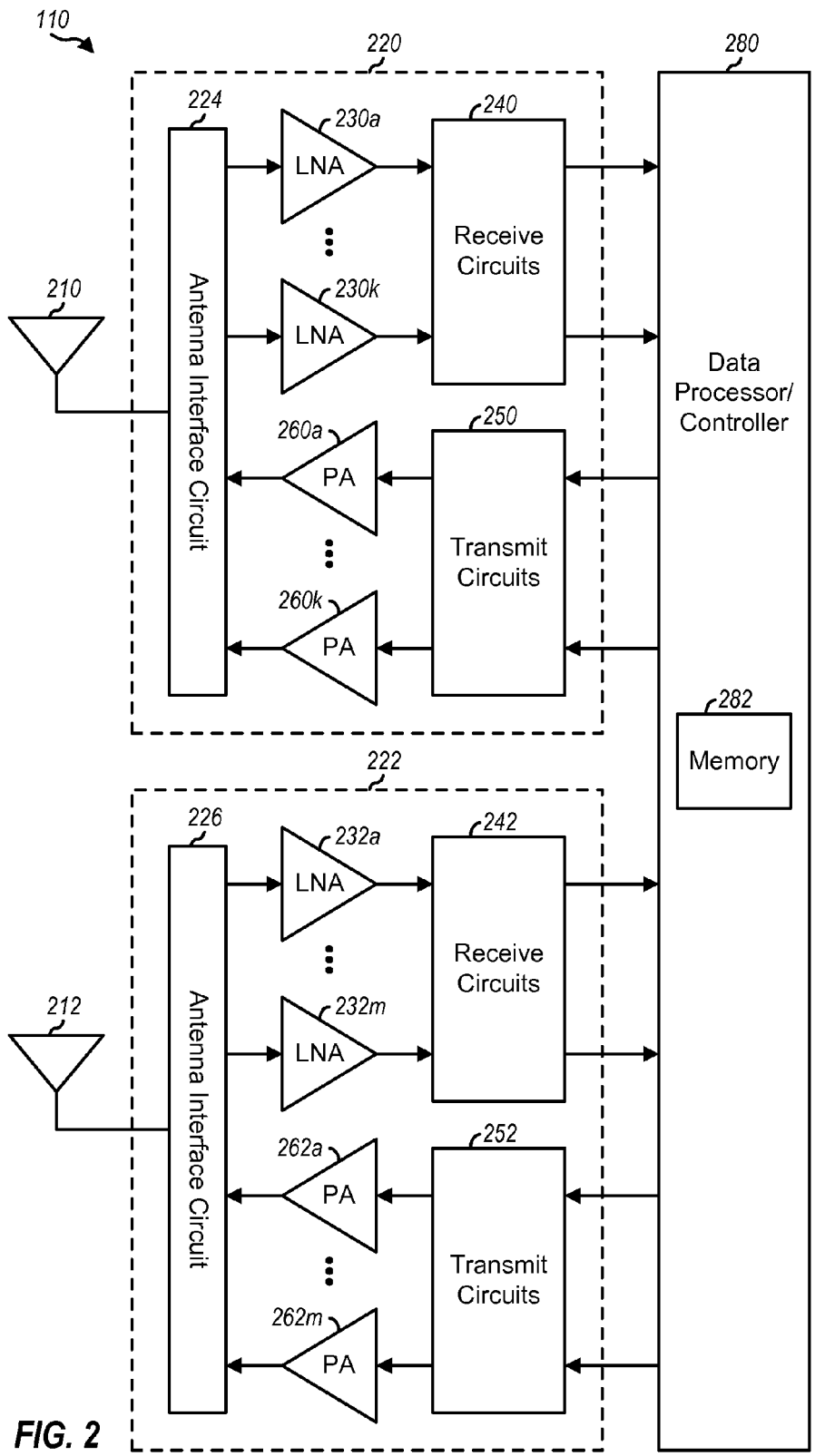
FIG. 2 shows a block diagram of the wireless device in FIG. 1.

FIG. 2 shows a block diagram of an exemplary design of wireless device 110 in FIG. 1. In this exemplary design, wireless device 110 includes a transceiver 220 coupled to a primary antenna 210, a transceiver 222 coupled to a secondary antenna 212, and a data processor/controller 280. Transceiver 220 includes an antenna interface circuit 224, multiple (K) LNAs 230a to 230k, receive circuits 240, transmit circuits 250, and multiple (K) power amplifiers (PAs) 260a to 260k. Transceiver 222 includes an antenna interface circuit 226, multiple (M) LNAs 232a to 232m, receive circuits 242, transmit circuits 252, and multiple (M) PAs 262a to 262m. Transceivers 220 and 222 may support multiple frequency bands, carrier aggregation, multiple radio technologies, multiple wireless systems, receive diversity, transmit diversity, MIMO transmission from multiple transmit antennas to multiple receive antennas, etc., or any combination thereof.

For data reception, antenna 210 receives signals from base stations and/or other transmitter stations and provides a received RF signal to antenna interface circuit 224. Antenna interface circuit 224 provides one or more input RF signals to one or more selected LNAs 230. Antenna interface circuit 224 may include switches, duplexers, diplexers, transmit filters, receive filters, matching circuits, directional couplers, etc. Each selected LNA 230 amplifies its input RF signal and provides one or more amplified RF signals to receive circuits 240. Receive circuits 240 downconvert each amplified RF signal from RF to baseband, filter and amplify the downconverted signal, and provide an input baseband signal to data processor 280. Receive circuits 240 may include mixers, filters, amplifiers, matching circuits, oscillators, LO generators, phase locked loops (PLLs), etc.

For data transmission, data processor 280 processes (e.g., encodes and modulates) data to be transmitted and provides one or more output baseband signals to transmit circuits 250. Transmit circuits 250 amplify, filter, and upconvert each output baseband signal from baseband to RF and provide a resultant modulated signal to a selected PA 260. Transmit circuits 250 may include amplifiers, filters, mixers, matching circuits, oscillators, LO generators, PLLs, etc. Each selected PA 260 amplifies its modulated signal and provides an output RF signal having the proper transmit power level. The output RF signal from each selected PA 260 is routed through antenna interface circuit 224 and transmitted via antenna 210.

LNAs 232, receive circuits 242, transmit circuits 252, and PAs 262 within transceiver 222 may operate in similar manner as LNAs 230, receive circuits 240, transmit circuits 250, and PAs 260 within transceiver 220. Transceivers 220 and 222 may include other circuits not shown in FIG. 2. All or a portion of transceivers 220 and 222 may be implemented on one or more analog integrated circuits (ICs), RF ICs (RFICs), mixed-signal ICs, etc. For example, LNAs 230 and receive circuits 240 may be implemented on one module, which may be an RFIC, etc. The circuits in transceivers 220 and 222 may also be implemented in other manners.

Data processor/controller 280 may perform various functions for wireless device 110. For example, data processor 280 may perform processing for data being received via receiver circuits 240 and 242 and data being transmitted via transmit circuits 250 and 252. Controller 280 may control the operation of various circuits within transceivers 220 and 222. A memory 282 may store program codes and data for data processor/controller 280. Data processor/controller 280 may be implemented on one or more application specific integrated circuits (ASICs) and/or other ICs.

FIG. 2 shows an exemplary design of wireless device 110 with two transceivers 220 and 222 coupled to two antennas 210 and 212. In general, a wireless device may include any number of transceivers for any number of antennas. Each transceiver may include any number of LNAs and any number of PAs to support any number of frequency bands, any number of wireless systems, any number of radio technologies, etc.

LNAs 230 and 232 in FIG. 2 may have configurable gain in order to handle a range of signal conditions. An LNA with configurable gain may be implemented in various manners and with transistors of various types. Some exemplary circuit designs of LNAs implemented with N-channel metal oxide semiconductor (NMOS) transistors are described below.

Figure 3:
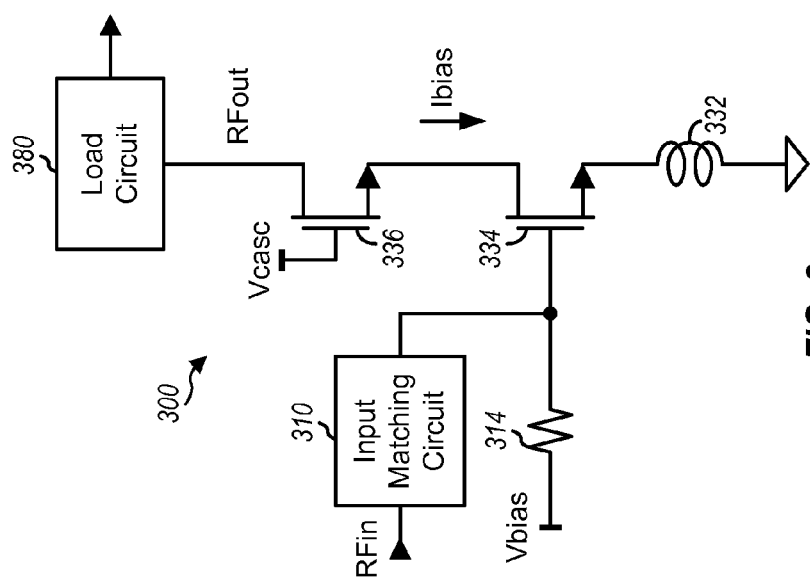
FIG. 3 shows a schematic diagram of an LNA with configurable gain.

FIG. 3 shows a schematic diagram of an LNA 300 with configurable gain. LNA 300 includes a source degeneration inductor 332, a gain transistor 334, and a cascode transistor 336. An input matching circuit 310 has one end receiving an input RF signal (RFin) and the other end coupled to the gate of gain transistor 334. Gain transistor 334 has its source coupled to one end of inductor 332 and its drain coupled to the source of cascode transistor 336. The other end of inductor 332 is coupled to circuit ground. Cascode transistor 336 has its gate receiving a control signal (Vcasc) and its drain coupled to a load circuit 380. Gain transistor 334 and cascode transistor 336 may be implemented with NMOS transistors, as shown in FIG. 3, or with transistors of other types. A resistor 314 has one end coupled to the gate of gain transistor 334 and the other end receiving a bias voltage (Vbias) for gain transistor 334.

Within LNA 300, gain transistor 334 amplifies the RFin signal and provides an amplified signal. Cascode transistor 336 buffers the amplified signal and provides an output RF signal (RFout) to load circuit 380. Source degeneration inductor 332 performs several functions. First, inductor 332 enables LNA 300 to obtain good dynamic range (e.g., low noise figure) and achieve high sensitivity for a receiver with low power consumption. Second, inductor 332 helps with input matching of LNA 300.

Gain transistor 334 may be biased with a bias current of Ibias, which may be determined by the Vbias voltage applied to the gate of gain transistor 334 via resistor 314. The bias current may be selected to obtain the desired gain, linearity, and dynamic range for LNA 300. The bias voltage may be adjusted such that a desired amount of bias current flows through gain transistor 334. A higher gain may be obtained for LNA 300 with a higher bias current, and vice versa.

The input RF signal provided to LNA 300 may include one or more desired signals as well as interfering signals. A desired signal is a transmitted signal to be received by a wireless device. An interfering signal is a transmitted signal not being received by the wireless device. The input RF signal may include a jammer, which is an interfering signal having a much larger amplitude than that of a desired signal and located close in frequency to the desired signal. Non-linearity of LNA 300 may result in the jammer causing intermodulation distortion (IMD). The IMD may overlap a desired signal in frequency and may act as additional noise that may adversely impact reception of the desired signal.

The inductance of source degeneration inductor 332 and the amount of bias current may be selected to obtain the desired gain, dynamic range, and linearity for LNA 300. Linearity of LNA 300 may be quantified by a third-order intercept point (IP3). When a strong jammer is present, LNA 300 and/or a receiver may saturate, which may degrade signal-to-noise ratio (SNR). LNA 300 should have high linearity when jammers are present in order to mitigate SNR degradation.

LNA 300 may have a configurable gain in order to handle different signal conditions. LNA 300 may operate in (i) a high-gain mode when jammers are not present in the input RF signal or (ii) a low-gain mode when a jammer is present in the input RF signal. For example, LNA 300 may have a gain of 6 to 9 decibels (dB) lower in the low-gain mode than the high-gain mode. The lower gain of LNA 300 in the low-gain mode may help a receiver meet linearity requirements in the presence of a jammer.

In general, an LNA or a receiver may saturate when a strong jammer is present, which may degrade SNR. One way to avoid saturation is to reduce the gain of the LNA by reducing the bias current. However, if the bias current is reduced too much, then input matching by a source degeneration inductor may be adversely impacted. Hence, the bias current may be reduced by an amount that is limited by input matching constraint. Limiting the bias current to a certain minimum amount would result in a limited dynamic range for the LNA. The LNA may then be unable to handle strong jammers exceeding a certain level without excessively degrading SNR.

In an aspect of the present disclosure, a split amplifier comprising multiple amplifier circuits and a linearization circuit may be used to obtain good performance for different signal conditions. One or more amplifier circuits may be enabled to obtain the desired gain. The linearization circuit may be enabled or disabled to obtain the desired linearity. The split amplifier may have good dynamic range, high linearity, and other desirable characteristics. The configurable gain of the split amplifier may prevent a receiver from saturation. The high linearity of the split amplifier may allow the receiver to obtain high SNR.

Figure 4A:
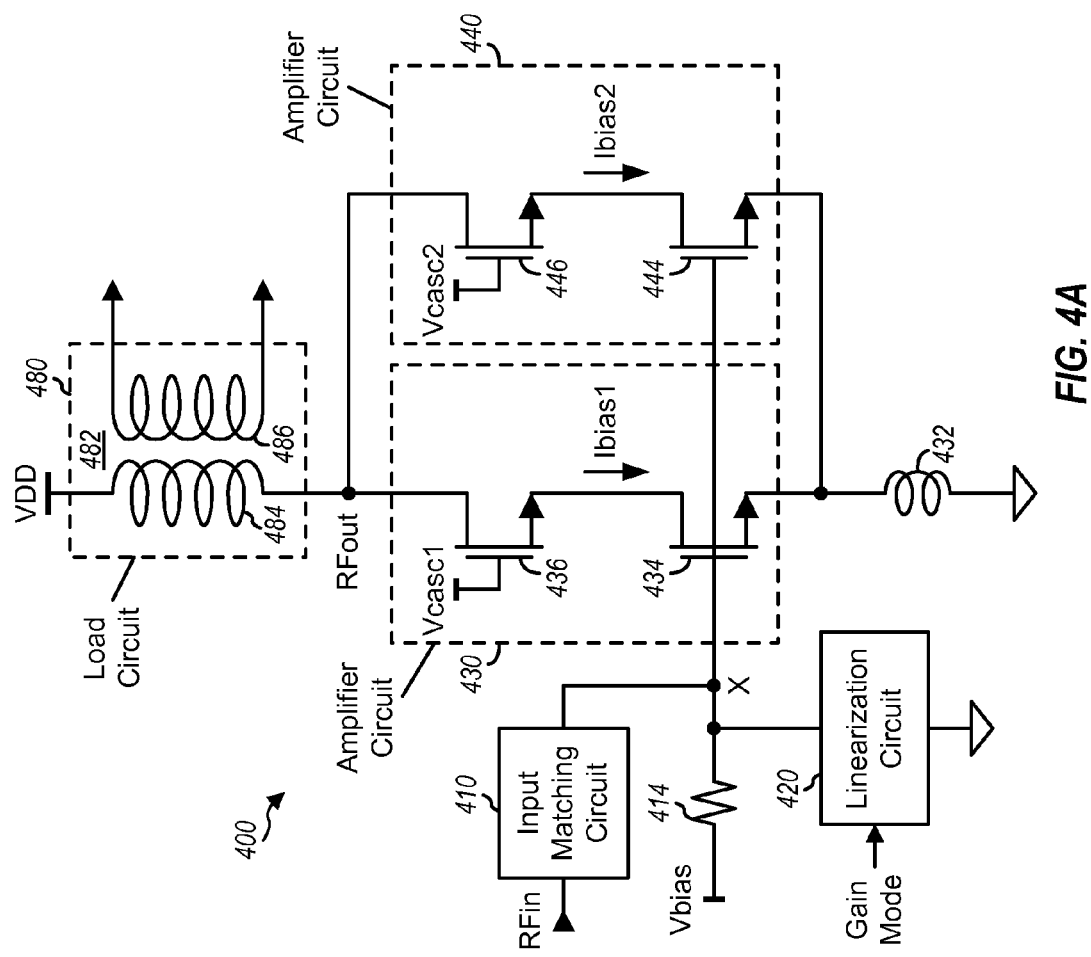
FIGS. 4A, 4B and 4C show schematic diagrams of three exemplary designs of a split LNA with configurable gain and linearization circuitry.

FIG. 4A shows a schematic diagram of an exemplary design of a split LNA 400 with configurable gain and linearization circuitry. LNA 400 may be used for any of LNAs 230 and 232 in FIG. 2. LNA 400 includes two amplifier circuits 430 and 440, a source degeneration inductor 432, and a linearization circuit 420.

In the exemplary design shown in FIG. 4A, amplifier circuit 430 includes a gain transistor 434 and a cascode transistor 436. Amplifier circuit 440 includes a gain transistor 444 and a cascode transistor 446. Gain transistor 434 has its source coupled to one end of inductor 432, its gate coupled to node X, and its drain coupled to the source of cascode transistor 436. The other end of inductor 432 is coupled to circuit ground. Cascode transistor 436 has its gate receiving a first control signal (Vcasc1) and its drain coupled to a load circuit 480. Gain transistor 444 has its source coupled to the source of gain transistor 434, its gate coupled to the gate of gain transistor 434, and its drain coupled to the source of cascode transistor 446. Cascode transistor 446 has its gate receiving a second control signal (Vcasc2) and its drain coupled to load circuit 480. Gain transistors 434 and 444 and cascode transistors 436 and 446 may be implemented with NMOS transistors, as shown in FIG. 4A, or with transistors of other types.

An input matching circuit 410 has one end receiving an input RF signal (RFin) and the other end coupled to the gates of gain transistors 434 and 444 at node X. A resistor 414 has one end coupled to node X and the other end receiving a bias voltage (Vbias) for gain transistors 434 and 444. Input matching circuit 410 and resistor 414 may be considered as part of LNA 400 or as being external to LNA 400.

Linearization circuit 420 is coupled between the gates of gain transistors 434 and 444 and circuit ground. Linearization circuit 420 receives a gain control signal (Gain Mode) and is enabled or disabled based on the gain control signal.

In the exemplary design shown in FIG. 4A, load circuit 480 includes a transformer 482 comprising a primary coil 484 and a secondary coil 486. Primary coil 484 is coupled between the drain of cascode transistor 436 and a power supply voltage (VDD). Secondary coil 486 provides a differential output RF signal to a downconverter (not shown in FIG. 4A).

In the exemplary design shown in FIG. 4A, LNA 400 is split into two LNA sections, which are coupled in parallel. A first LNA section comprises amplifier circuit 430, and a second LNA section comprises amplifier circuit 440. One or two LNA sections may be enabled depending on the desired gain and linearity.

LNA 400 may be split based on any combination of ratios for the two LNA sections. In a first exemplary design, the first LNA section may correspond to ⅔ of LNA 400, and the second LNA section may correspond to ⅓ of LNA 400. In this exemplary design, LNA 400 may have a W/L aspect ratio, gain transistor 434 in the first LNA section may have a size of (⅔)*(W/L), and gain transistor 444 in the second LNA section may have a size of (⅓)*(W/L), where W denotes the width and L denotes the length of a transistor. In a second exemplary design, each LNA section may correspond to ½ of LNA 400. In this exemplary design, gain transistors 434 and 444 may each have a size of (½)*(W/L). LNA 400 may also be split based on some other combination of ratios for the two LNA sections. Only the first LNA section or only the second LNA section may be enabled in the low-gain mode.

LNA 400 may support multiple gain modes, which may include a high-gain mode and a low-gain mode. LNA 400 may operate in the high-gain mode and provide a high gain when jammers are not present in the input RF signal. LNA 400 may operate in the low-gain mode and provide a lower gain when a jammer is present in the input RF signal. LNA 400 may have a lower gain in the low-gain mode than in the high-gain mode, which may help a receiver meet linearity requirements in the presence of a jammer. Each gain mode may be associated with a particular gain value or a range of gain values for LNA 400.

In the high-gain mode, both amplifier circuits 430 and 440 may be enabled by applying appropriate control voltages at the gates of cascode transistors 436 and 446. Gain transistors 434 and 444 may each be biased with a sufficient amount of bias current to obtain the desired gain, linearity, dynamic range, and noise figure for LNA 400 in the high-gain mode. Gain transistors 434 and 444 amplify the RFin signal and provide amplified signals, which are buffered by cascode transistors 436 and 446, respectively. The buffered signals at the drains of cascode transistors 436 and 446 are summed to obtain the RFout signal.

In the high-gain mode, linearization circuit 420 may be disabled and disconnected from the gates of gain transistors 434 and 444. Input matching circuit 410 may provide input matching for LNA 400 in the high-gain mode.

In the low-gain mode, only one amplifier circuit 430 or 440 may be enabled by applying an appropriate control voltage at the gate of one cascode transistor 436 or 446, and the other amplifier circuit may be disabled by applying a low voltage (e.g., 0 Volts (V)) at the gate of the other cascode transistor. An amplifier circuit may also be disabled by applying an appropriate control voltage (e.g., 0V) at the gate of a gain transistor. For clarity, the description below assumes that amplifier circuit 430 is enabled and amplifier circuit 440 is disabled in the low-gain mode. Gain transistor 434 may be biased with a sufficient amount of bias current to obtain the desired gain, linearity, dynamic range, and noise figure for LNA 400 in the low-gain mode. Gain transistor 434 amplifies the RFin signal and provides an amplified signal. Cascode transistor 436 buffers the amplified signal and provides the RFout signal. Gain transistor 434 may be biased with less bias current in the low-gain mode in order to reduce the gain of LNA 400.

In the low-gain mode, linearization circuit 420 may be enabled and connected to the gates of gain transistors 434 and 444. Linearization circuit 420 may reduce the voltage swing at the gate of gain transistor 434, which may then improve the linearity (e.g., IP3) of LNA 400.

FIG. 4A shows an exemplary design of split LNA 400 with two amplifier circuits 430 and 440 for two LNA sections. In general, a split LNA may include any number of amplifier circuits for any number of LNA sections. A split LNA may be split based on any combination of ratios for the LNA sections. For example, a split LNA may include N amplifier circuits for N LNA sections and may be split as follows:

$$1 = \sum_{n=1}^{N} F_n, \qquad \text{Eq (1)}$$

where $F_n$ is a fractional portion of the split LNA for the n-th LNA section, and N is an integer value greater than one.

A split LNA may have a W/L aspect ratio. A gain transistor in the n-th LNA section may have a size of $F_n*(W/L)$.

A split LNA may support any number of gain modes. Each gain mode may be associated with a different set of amplifier circuits being enabled. Each enabled amplifier circuit may have a fixed bias current or a variable bias current. Each gain mode may be associated with a particular gain value or a particular range of gain values, which may be dependent on the enabled amplifier circuit(s) and the bias current of each enabled amplifier circuit.

FIG. 4A shows an exemplary design of split LNA 400 with configurable gain and linearization circuitry. LNA 400 may also be implemented in other manners. In another exemplary design, an LNA may include (i) at least one gain transistor coupled to at least one source degeneration inductor and (ii) at least one additional gain transistor coupled directly to circuit ground. The gain transistor(s) or the additional gain transistor(s) may be selected, e.g., depending on signal conditions. In another exemplary design, an LNA may include a feedback circuit coupled between an output and an input of the LNA. The feedback circuit may comprise a resistor, a capacitor, a transistor, some other circuit component, or a combination thereof. The feedback circuit may help with input matching and may also improve linearity of the LNA.

In another exemplary design, an LNA may include a cascode circuit in place of a cascode transistor. The cascode circuit may include (i) a first cascode transistor coupled between the drain of a gain transistor and an intermediate node, (ii) a second cascode transistor coupled between the intermediate node and an output of the LNA, and (iii) a shunt transistor coupled between the intermediate node and circuit ground. When the cascode circuit is enabled, the first and second cascode transistors may be turned ON to provide an output RF signal at the LNA output, and the shunt transistor may be turned OFF. When the cascode circuit is disabled, the first and second cascode transistors may be turned OFF to provide no output RF signal at the LNA output, and the shunt transistor may be turned ON to pull the intermediate node to circuit ground and provide better isolation between the LNA output and the gain transistor. Better isolation may be desirable when the same load circuit is shared by multiple gain transistors, e.g., in different LNAs.

In an exemplary design, source degeneration inductor 432 may have a fixed inductance. In another exemplary design, inductor 432 may be a configurable inductor having a variable or programmable inductance. For example, inductor 432 may be implemented with multiple inductors coupled in series and/or multiple inductors coupled in parallel. Different inductance values may be obtained by (i) shorting one or more series-coupled inductors via one or more switches and/or (ii) disconnecting one or more parallel-coupled inductors via one or more switches.

Load circuit 480 may be implemented in other manners. In another exemplary design, a load circuit may include an inductor and possibly a capacitor coupled between the VDD supply and the drain of cascode transistor 436. In yet another exemplary design, a load circuit may include a P-channel metal oxide semiconductor (PMOS) transistor having its source coupled to the VDD supply and its drain coupled to the drain of cascode transistor 436. The PMOS transistor may provide an active load for cascode transistor 436.

In the exemplary design shown in FIG. 4A, linearization circuit 420 is coupled between the gates of gain transistors 434 and 444 and circuit ground. A linearization circuit may also be coupled to other nodes of an LNA. For example, a linearization circuit may be coupled between the source or drain of a gain transistor and circuit ground, or between the gate and source of the gain transistor, or at some other node of the LNA. Linearization circuit 420 may be implemented in various manners. Some exemplary designs of linearization circuit 420 are described below.

Figure 4B:
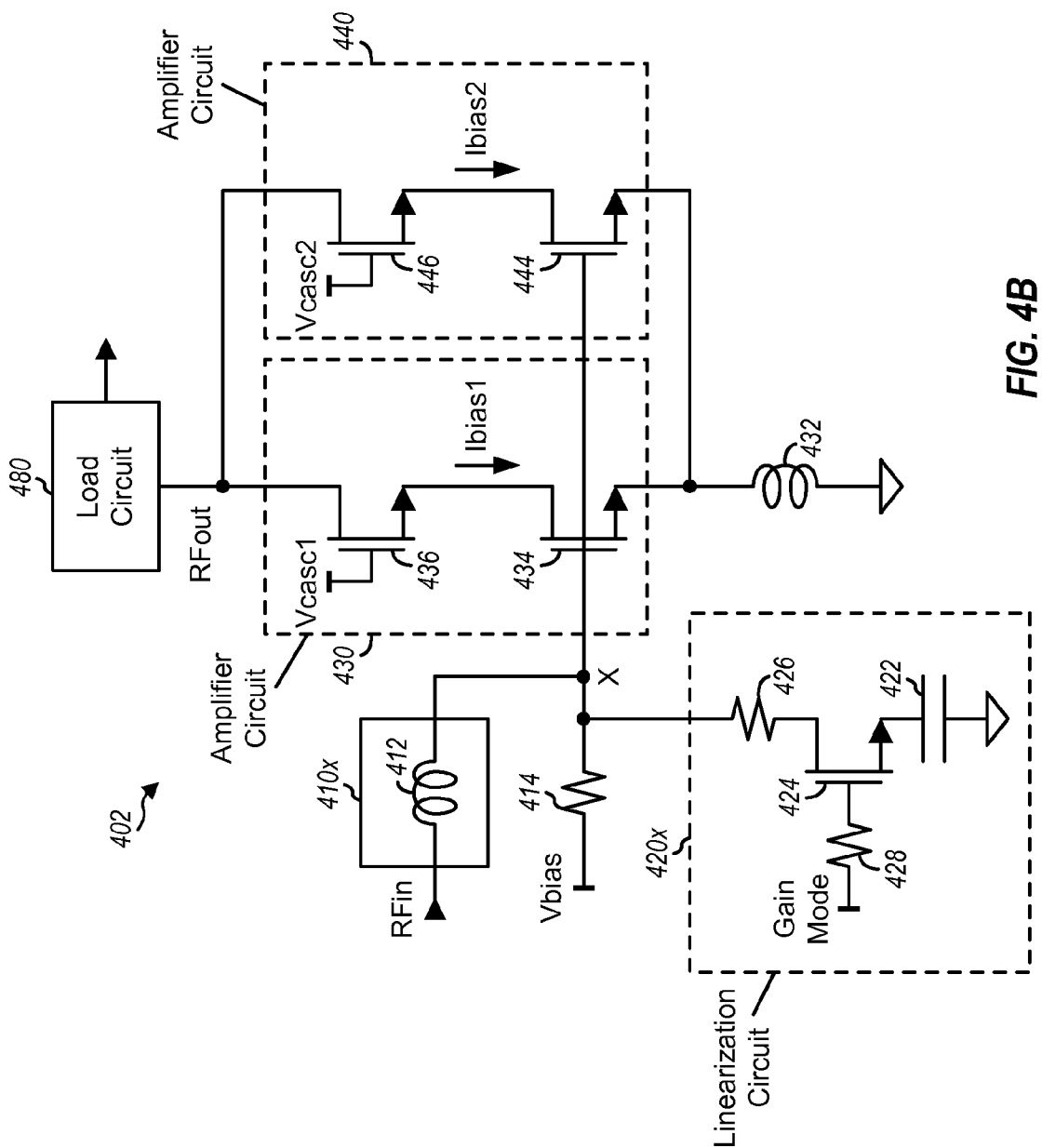

FIG. 4B shows a schematic diagram of an exemplary design of a split LNA 402, which may also be used for any of LNAs 230 and 232 in FIG. 2. LNA 402 includes all circuit components in LNA 400 in FIG. 4A with the following differences. LNA 402 includes an input matching circuit 410x and a linearization circuit 420x, which are one exemplary design of input matching circuit 410 and linearization circuit 420 in FIG. 4A.

Within linearization circuit 420x, a transistor 424 has its source coupled to one end of a capacitor 422, its gate coupled to one end of a resistor 428, and its drain coupled to one end of a resistor 426. The other end of capacitor 422 is coupled to circuit ground. The other end of resistor 426 is coupled to the gates of gain transistors 434 and 444. The other end of resistor 428 receives the Gain Mode control signal. The arrangement of transistor 424, capacitor 422, and resistor 426 in FIG. 4B may allow LNA 402 to achieve high sensitivity in the high-gain mode when linearization circuit 420 is disabled/disconnected, with transistor 424 being turned OFF.

Within linearization circuit 420x, an RC network is formed by resistor 426 and capacitor 422. Resistor 426 decreases the quality factor (Q) of an input tank circuit formed by inductors 412 and 432 and parasitics capacitance between the gate and source of gain transistor 434. The lower Q of the input tank circuit reduces the voltage swing at the gate of gain transistor 434, which improves linearity (e.g., IP3) of LNA 402. The position/location of resistor 426 as shown in FIG. 4B allows LNA 402 to achieve high sensitivity and low noise figure in the high-gain mode.

Figure 7:
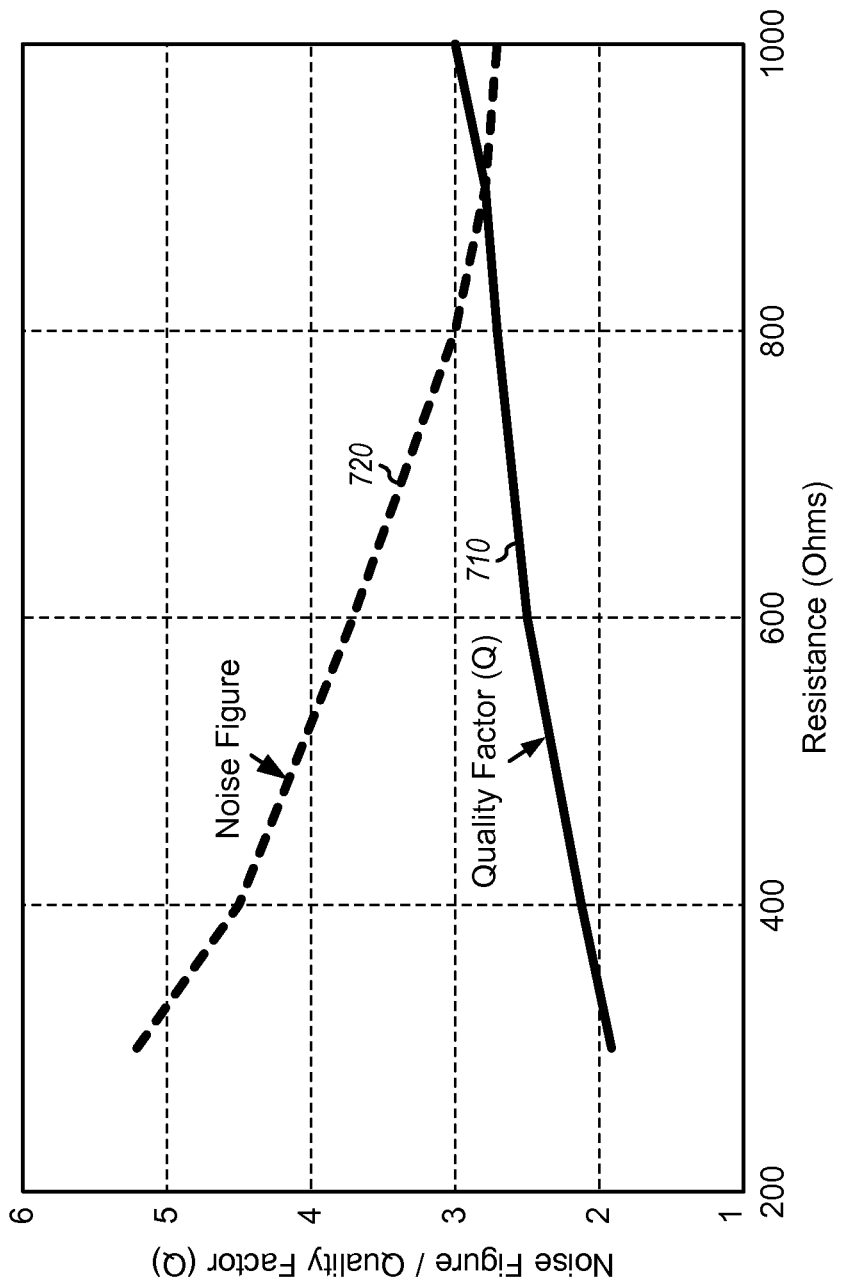
FIG. 7 shows plots of performance of the split LNA in FIG. 4B.

FIG. 7 shows exemplary performance of LNA 402 for different values of resistor 426 within linearization circuit 420x. In FIG. 7, the horizontal axis denotes the resistance of resistor 426 and is given in units of Ohms. The vertical axis denotes noise figure and also denotes the Q of the input tank circuit. A plot 710 shows the Q of the input tank circuit versus the resistance of resistor 426. A plot 720 shows the noise figure of LNA 402 versus the resistance of resistor 426. As shown in FIG. 7, lower resistance of resistor 426 may improve linearity due to lower Q whereas higher resistance may improve noise figure.

Referring back to FIG. 4B, within linearization circuit 420x, capacitor 422 acts as an alternating current (AC) coupling capacitor that avoids disturbance of the Vbias voltage. Transistor 424 operates as a switch and is (i) turned ON to connect the RC network to the gate of gain transistor 434 or (ii) turned OFF to disconnect the RC network from the gate of gain transistor 434. Resistor 428 reduces the parasitics capacitance to ground at an intermediate node between the drain of transistor 424 and resistor 426. This may prevent the noise of resistor 428 from leaking when linearization circuit 420 is not in use and degrading the sensitivity of LNA 402 in the high-gain mode.

FIG. 4B shows an exemplary design of a linearization circuit. In general, a linearization circuit may comprise one or more resistors, or inductors, or capacitors, or other circuit components, or a combination thereof. The circuit components of a linearization circuit may be coupled in parallel and/or in series. A linearization circuit may also be coupled to the input of an LNA or to some other node of the LNA.

In the exemplary design shown in FIG. 4B, input matching circuit 410x comprises an inductor 412 coupled between the input and output of input matching circuit 410x. A single circuit component (e.g., only inductor 412) may be sufficient to obtain good input matching for LNA 402.

An input matching circuit may also be implemented in other manners. For example, an input matching circuit may comprise a shunt capacitor coupled between the input and circuit ground, or a shunt capacitor coupled between the output and circuit ground, or a capacitor coupled between the input and output of the input matching circuit, or some other circuit component coupled in other manners, or a combination thereof. Each capacitor may be a fixed capacitor or a configurable capacitor.

In general, input matching of an LNA may be achieved with an active circuit (e.g., comprising one or more transistors) and/or a passive circuit (e.g., comprising one or more resistors, inductors, capacitors, etc.). It may be desirable to use only one circuit component (e.g., one inductor) for input matching in order to reduce cost, power consumption, and circuit area. It may also be desirable to use the same circuit component (e.g., the same inductor) for input matching in both the high-gain mode and the low-gain mode.

Figure 4C:
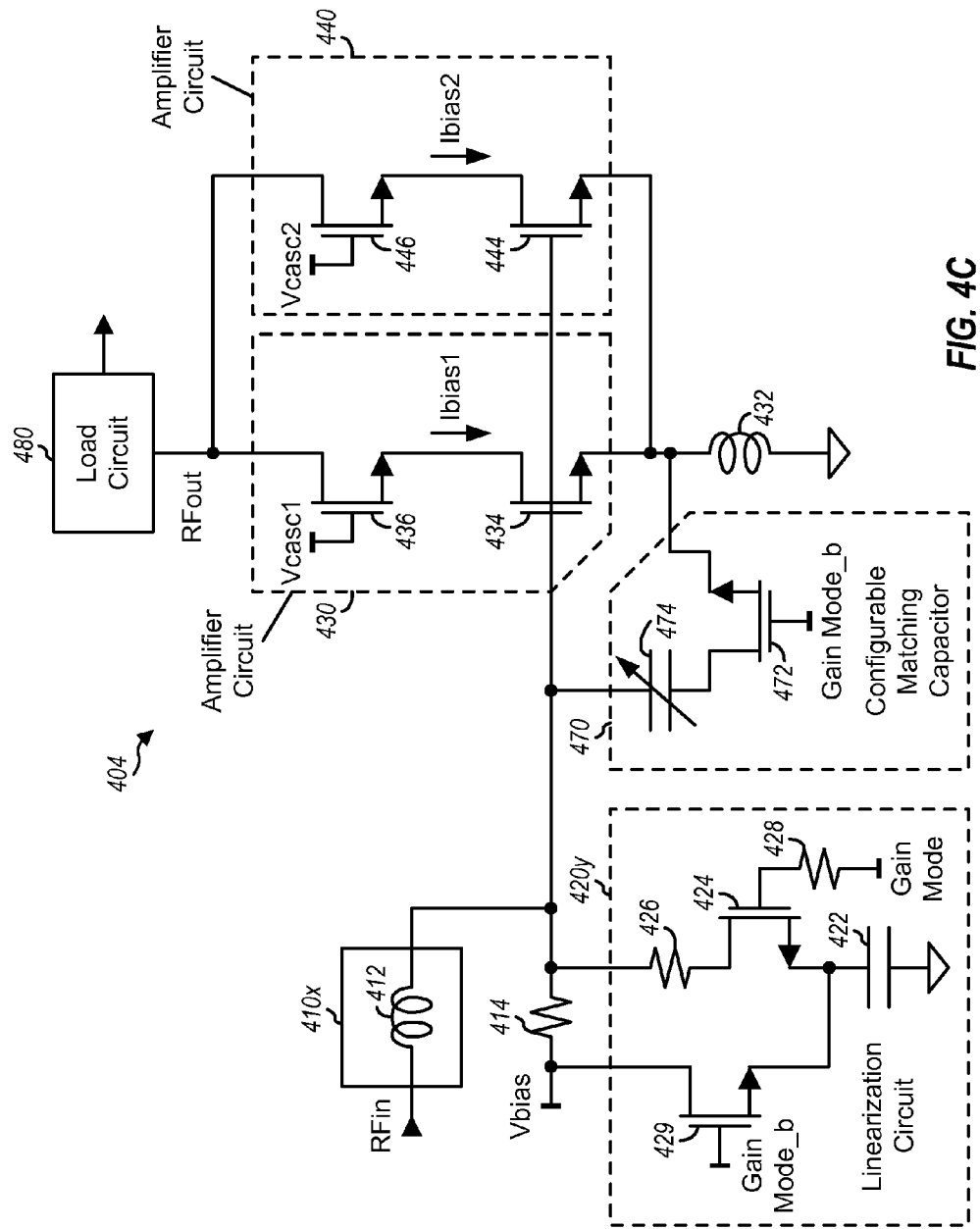

FIG. 4C shows a schematic diagram of an exemplary design of a split LNA 404, which may also be used for any of LNAs 230 and 232 in FIG. 2. LNA 404 includes all circuit components in LNA 402 in FIG. 4B with the following differences. LNA 404 includes a linearization circuit 420y, which is another exemplary design of linearization circuit 420 in FIG. 4A. LNA 404 further includes a configurable matching capacitor 470 coupled between the gate and source of gain transistor 434.

Linearization circuit 420y includes capacitor 422, transistor 424, and resistors 426 and 428, which are coupled as described above for linearization circuit 420x in FIG. 4B. Linearization circuit 420y further includes a transistor 429 having its source coupled to capacitor 422, its gate receiving a complementary gain control signal (Gain Mode_b), and its drain coupled to the Vbias voltage. The Gain Mode_b signal is complementary to the Gain Mode signal.

Transistor 429 may be used to pre-charge capacitor 422 to facilitate fast switching between the high-gain mode and the low-gain mode. In the high-gain mode, transistor 424 is turned OFF by the Gain Mode signal, and transistor 429 is turned ON by the Gain Mode_b signal. Capacitor 422 is disconnected from the gate of transistor 434 and is pre-charged to the Vbias voltage via transistor 429 in the high-gain mode. In the low-gain mode, transistor 424 is turned ON by the Gain Mode signal, and transistor 429 is turned OFF by the Gain Mode_b signal. Capacitor 422 is connected to the gate of transistor 434 and is maintained at the Vbias voltage via resistor 426 and transistor 424 in the low-gain mode. By pre-charging capacitor 422 via transistor 429 in the high-gain mode, a switch from the high-gain mode to the low-gain mode may be done more quickly.

In the exemplary design shown in FIG. 4C, configurable matching capacitor 470 includes a transistor 472 and an adjustable capacitor 474. Transistor 472 has its source coupled to the source of gain transistor 434, its gate receiving the Gain Mode_b control signal, and its drain coupled to one end of capacitor 474. The other end of capacitor 474 is coupled to the gate of gain transistor 434. Adjustable capacitor 474 may be used to adjust the input impedance of LNA 404 and to assist with input matching of LNA 404.

Adjustable capacitor 474 may be implemented in various manners. In an exemplary design, adjustable capacitor 474 may be implemented with a variable capacitor (varactor) having a capacitance that can be varied by an analog voltage.

In another exemplary design, adjustable capacitor 474 may be implemented with a bank of switchable capacitors. Each switchable capacitor may be implemented with a capacitor coupled in series with a switch, and the series combination may be coupled between the gate and source of gain transistor 434. A switchable capacitor may be selected by closing its switch or unselected by opening its switch. The capacitors in the bank of switchable capacitors may have (i) the same capacitance for thermometer decoding or (ii) different capacitances for binary or geometric weighting. A desired gate-to-source capacitance (Cgs) may be obtained by selecting an appropriate number or an appropriate combination of switchable capacitors. In this exemplary design, transistor 472 may be replaced with the switches for the switchable capacitors and may be omitted.

In an exemplary design, transistor 472 may be turned ON, and adjustable capacitor 474 may be coupled between the gate and source of gain transistor 434 in the high-gain mode. Transistor 472 may be turned OFF, and adjustable capacitor 474 may be decoupled from gain transistor 434 in the low-gain mode to allow greater reduction of bias current in the low-gain mode. Decoupling adjustable capacitor 474 may also increase the Q of the input tank circuit, which may enable further reduction of the bias current in the low-gain mode.

Wireless device 110 may concurrently receive multiple transmitted signals at different frequencies. These multiple transmitted signals may be sent by one or more base stations on multiple carriers at different frequencies for carrier aggregation. These multiple transmitted signals may also be sent by different base stations for coordinated multi-point (CoMP) transmission, handover, etc. These multiple transmitted signals may also be sent by base stations in different wireless systems for concurrent services such as voice/data, or data/data, or voice/voice, etc. For example, wireless device 110 may support dual SIM/dual standby (DSDS) and/or dual SIM/dual-active (DSDA) and may be able to concurrently communicate with multiple wireless systems such as TD-SCDMA and GSM systems, or LTE and GSM systems, or CDMA and GSM systems, etc. Wireless device 110 may include one or more SIMO LNAs and/or one or more MIMO LNAs to support carrier aggregation, CoMP, concurrently services from multiple wireless systems, etc.

Figure 5A:
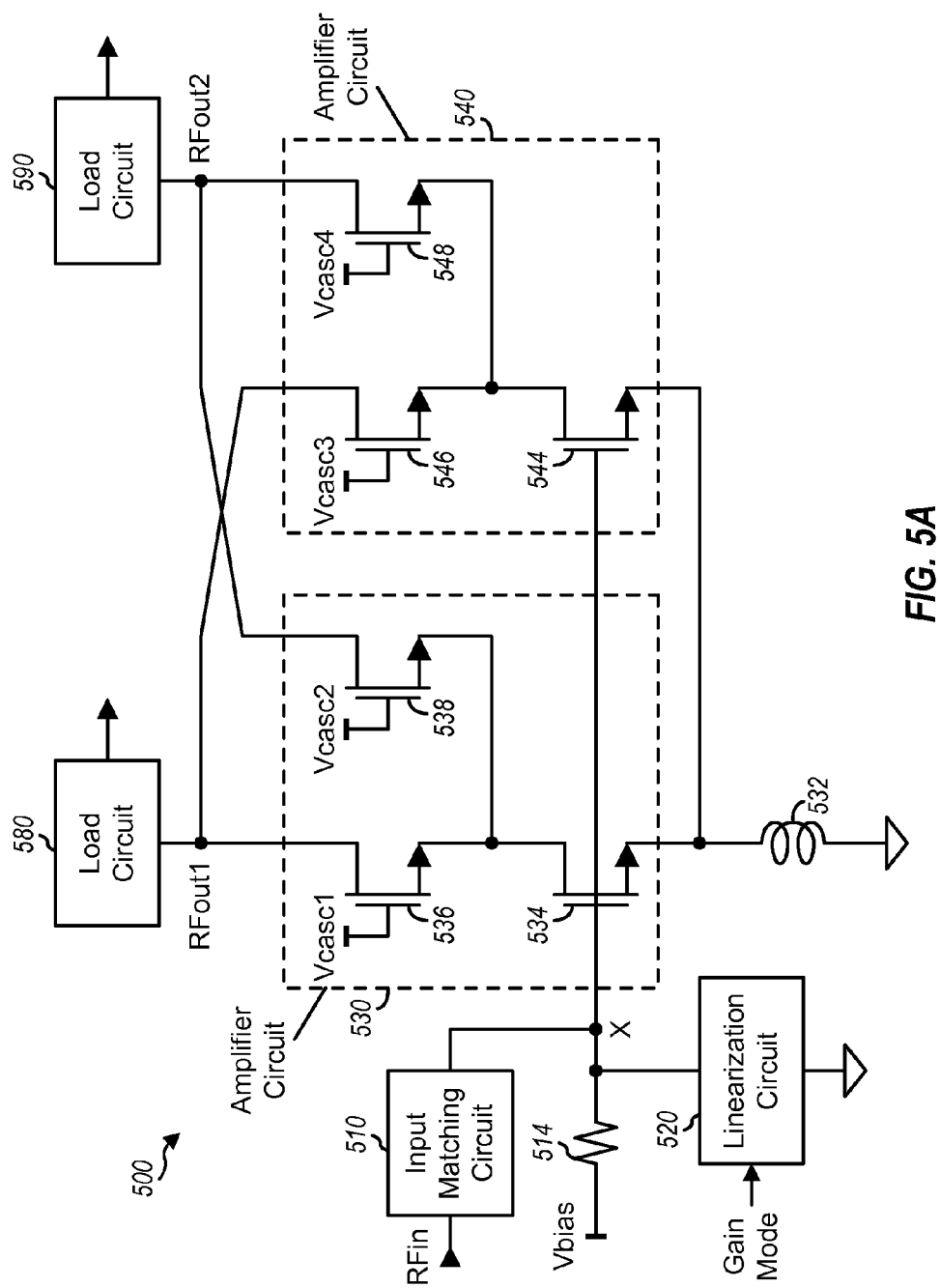
FIGS. 5A and 5B show schematic diagrams of two exemplary designs of a split single-input multiple-output (SIMO) LNA.

FIG. 5A shows a schematic diagram of an exemplary design of a split SIMO LNA 500, which may also be used for any of LNAs 230 and 232 in FIG. 2. SIMO LNA 500 includes one LNA input receiving one input RF signal (RFin) (which may be for one band) and two LNA outputs providing two output RF signals (RFout1 and RFout2) (which may be for two sets of carriers). SIMO LNA 500 includes two amplifier circuits 530 and 540, a source degeneration inductor 532, and a linearization circuit 520.

In the exemplary design shown in FIG. 5A, amplifier circuit 530 includes a gain transistor 534 and two cascode transistors 536 and 538. Amplifier circuit 540 includes a gain transistor 544 and two cascode transistors 546 and 548. Gain transistor 534 has its source coupled to one end of inductor 532, its gate coupled to node X, and its drain coupled to the sources of cascode transistors 536 and 538. The other end of inductor 532 is coupled to circuit ground. Cascode transistor 536 has its gate receiving a first control signal (Vcasc1) and its drain coupled to a load circuit 580. Cascode transistor 538 has its gate receiving a second control signal (Vcasc2) and its drain coupled to a load circuit 590. Gain transistor 544 has its source coupled to the source of gain transistor 534, its gate coupled to the gate of gain transistor 534, and its drain coupled to the sources of cascode transistors 546 and 548.

Cascode transistor 546 has its gate receiving a third control signal (Vcasc3) and its drain coupled to load circuit 580. Cascode transistor 548 has its gate receiving a fourth control signal (Vcasc4) and its drain coupled to load circuit 590. Gain transistors 534 and 544 and cascode transistors 536, 538, 546 and 548 may be implemented with NMOS transistors, as shown in FIG. 5A, or with transistors of other types.

In the exemplary design shown in FIG. 5A, LNA 500 is split into two LNA sections. A first LNA section includes amplifier circuit 530, and a second LNA section includes amplifier circuit 540. LNA 500 may be split based on any combination of ratios for the two LNA sections. In a first exemplary design, the first LNA section may correspond to ⅔ of LNA 500, and the second LNA section may correspond to ⅓ of LNA 500. In a second exemplary design, each LNA section may correspond to ½ of LNA 500. LNA 500 may also be split based on some other combination of ratios for the two LNA sections.

SIMO LNA 500 may operate in a single-output mode or a multi-output mode at any given moment. In the single-output mode, LNA 500 receives an input RF signal comprising at least one transmitted signal (e.g., on one set of carriers) and provides one output RF signal to one load circuit 580 or 590. In the multi-output mode, LNA 500 receives an input RF signal comprising at least two transmitted signals (e.g., on two sets of carriers) and provides two output RF signals (e.g., one output RF signal for each set of carriers) to two load circuits 580 and 590.

SIMO LNA 500 may support multiple gain modes in the single-output mode and/or the multi-output mode. For example, LNA 500 may support a high-gain mode and a low-gain mode in the multi-output mode. Alternatively or additionally, LNA 500 may support a high-gain mode and a low-gain mode in the single-output mode. In the high-gain mode, both amplifier circuits 530 and 540 may be enabled by applying appropriate control voltages to one or more cascode transistors in each amplifier circuit. Linearization circuit 520 may be disabled. In the low-gain mode, only one amplifier circuit 530 or 540 may be enabled by applying appropriate control voltages to one or more cascode transistors in the enabled amplifier circuit. Linearization circuit 520 may be enabled. Linearization circuit 520 may reduce the voltage swing at the gate of gain transistor 534 or 544, which may then improve the linearity of LNA 500.

In the single-output mode with high gain, gain transistors 534 and 544 may be turned ON. Furthermore, cascode transistors 536 and 546 may be turned ON to provide the RFout1 signal to load circuit 580. Alternatively, cascode transistors 538 and 548 may be turned ON to provide the RFout2 signal to load circuit 590.

In the single-output mode with low gain, either gain transistor 534 or 544 may be turned ON. If gain transistor 534 is turned ON, then either (i) cascode transistor 536 may be turned ON to provide the RFout1 signal or (ii) cascode transistor 538 may be turned ON to provide the RFout2 signal. If gain transistor 544 is turned ON, then either (i) cascode transistor 546 may be turned ON to provide the RFout1 signal or (ii) cascode transistor 548 may be turned ON to provide the RFout2 signal.

In the multi-output mode with high gain, gain transistors 534 and 544 may be turned ON. Furthermore, all four cascode transistors 536, 538, 546 and 548 may be turned ON to provide the RFout1 and RFout2 signals.

In the multi-output mode with low gain, gain transistor 534 and cascode transistors 536 and 538 may be turned ON to provide the RFout1 and RFout2 signals. Alternatively, gain transistor 544 and cascode transistors 546 and 548 may be turned ON to provide the RFout1 and RFout2 signals.

In one exemplary design, gain transistors 534 and 544 may each be applied a fixed bias current when turned ON. In this exemplary design, LNA 500 may provide a fixed gain in each mode. In another exemplary design, gain transistor 534 and/or 544 may be applied a variable bias current when turned ON. In this exemplary design, LNA 500 may provide a range of gain values in each mode.

FIG. 5A shows an exemplary design of split SIMO LNA 500 with two amplifier circuits 530 and 540 for two LNA sections. In general, a split SIMO LNA may include N amplifier circuits for N LNA sections, where N may be any integer value greater than one. A split SIMO LNA may be split based on any combination of ratios for the LNA sections.

FIG. 5A also shows an exemplary design in which each amplifier circuit includes two cascode transistors for two LNA outputs. In general, an amplifier circuit may include M cascode transistors to provide up to M output RF signals at M LNA outputs, where M may be any integer value greater than one.

Figure 5B:
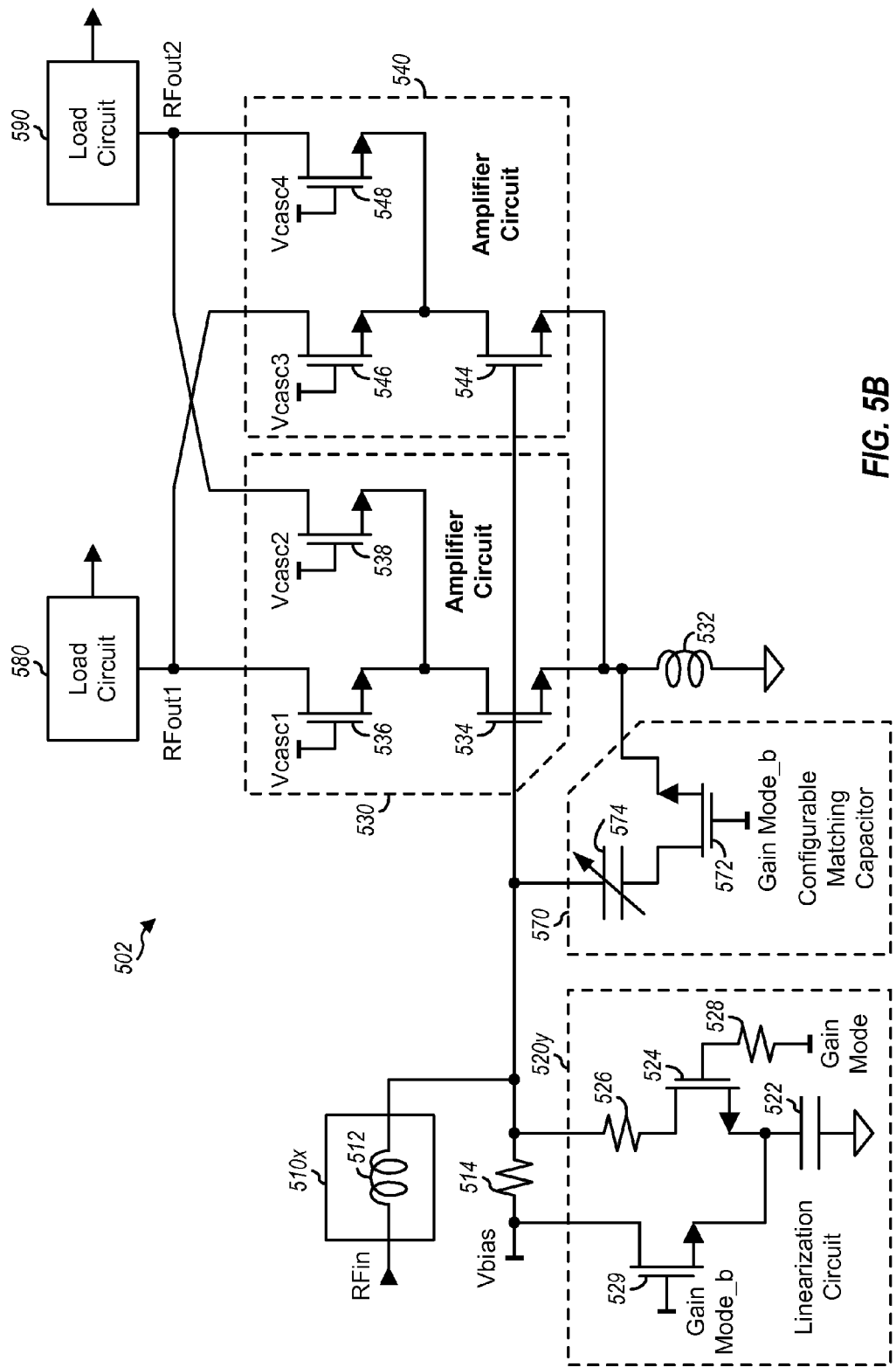

FIG. 5B shows a schematic diagram of an exemplary design of a split SIMO LNA 502, which may also be used for any of LNAs 230 and 232 in FIG. 2. SIMO LNA 502 includes all circuit components in SIMO LNA 500 in FIG. 5A with the following differences. SIMO LNA 500 includes a linearization circuit 520$y$, which is one exemplary design of linearization circuit 520 in FIG. 5A. SIMO LNA 502 further includes a configurable matching capacitor 570 coupled between the gate and source of gain transistor 534. Linearization circuit 520$y$ includes a capacitor 522, transistors 524 and 529, and resistors 526 and 528, which are coupled as shown in FIG. 5B. Configurable matching capacitor 570 includes a transistor 572 and a capacitor 574, which are coupled as shown in FIG. 5B.

Figure 6:
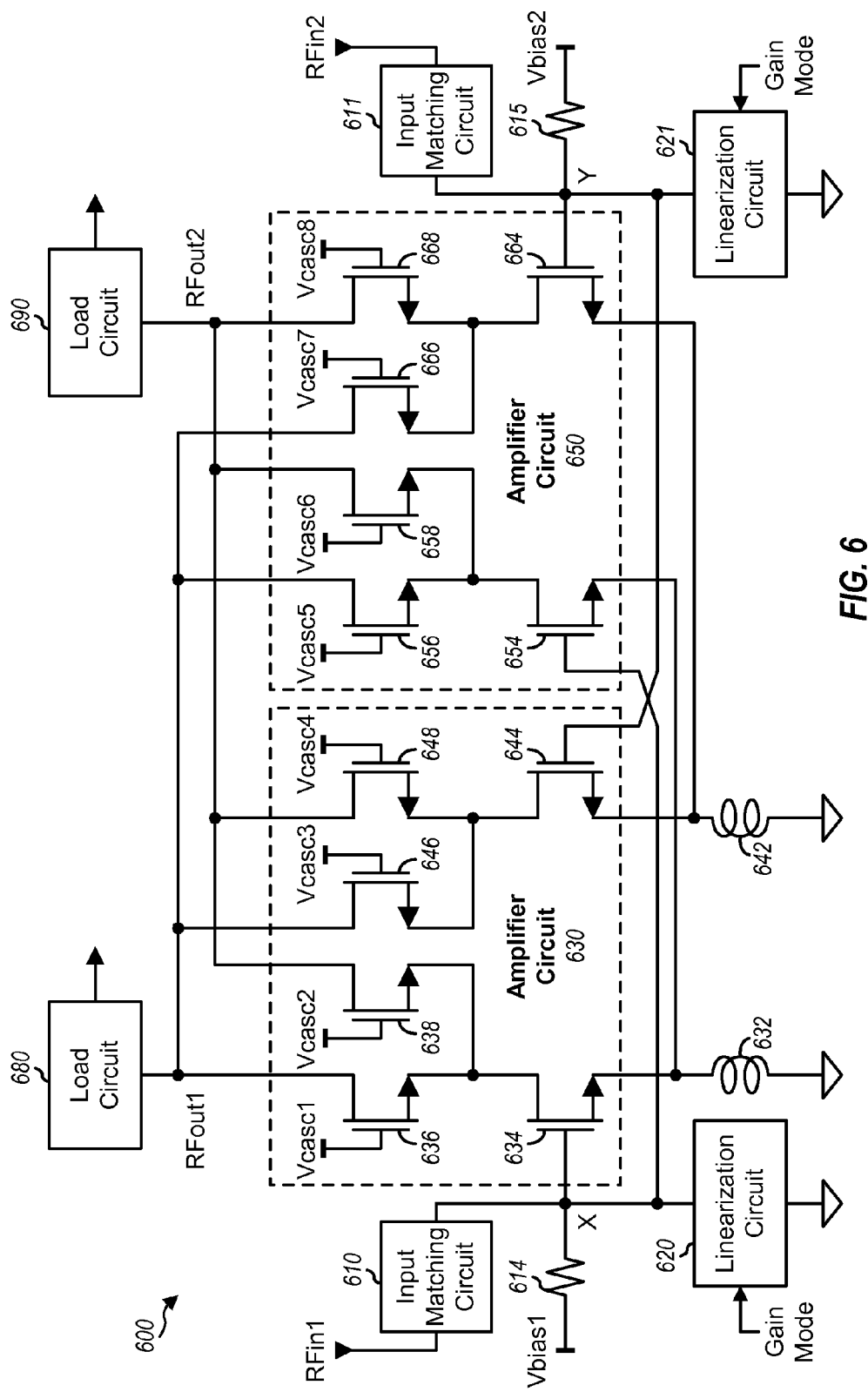
FIG. 6 shows a schematic diagram of an exemplary design of a split multiple-input multiple-output (MIMO) LNA.

FIG. 6 shows a schematic diagram of an exemplary design of a split MIMO LNA 600, which may also be used for any of LNAs 230 and 232 in FIG. 2. MIMO LNA 600 includes two LNA inputs receiving two input RF signals (RFin1 and RFin2) (which may be for two bands) and two LNA outputs providing two output RF signals (RFout1 and RFout2) (which may be for two sets of carriers). MIMO LNA 600 includes amplifier circuits 630 and 650, source degeneration inductors 632 and 642, and linearization circuits 620 and 621.

In the exemplary design shown in FIG. 6, amplifier circuit 630 includes gain transistors 634 and 644 and cascode transistors 636, 638, 646 and 648. Gain transistors 634 and 644 have their gates coupled to nodes X and Y, respectively, and their sources coupled to one end of inductors 632 and 642, respectively. The other end of inductors 632 and 642 are coupled to circuit ground. Cascode transistors 636 and 638 have their sources coupled to the drain of gain transistor 634, their gates receiving Vcasc1 and Vcasc2 control signals, respectively, and their drains coupled to load circuits 680 and 690, respectively. Cascode transistors 646 and 648 have their sources coupled to the drain of gain transistor 644, their gates receiving Vcasc3 and Vcasc4 control signals, respectively, and their drains coupled to load circuits 680 and 690, respectively.

In the exemplary design shown in FIG. 6, amplifier circuit 650 includes gain transistors 654 and 664 and cascode transistors 656, 658, 666 and 668. Gain transistors 654 and 664 have their gates coupled to nodes X and Y, respectively, and their sources coupled to one end of inductors 632 and 642, respectively. Cascode transistors 656 and 658 have their sources coupled to the drain of gain transistor 654, their gates receiving Vcasc5 and Vcasc6 control signals, respectively, and their drains coupled to load circuits 680 and 690, respectively. Cascode transistors 666 and 668 have their sources coupled to the drain of gain transistor 664, their gates receiving Vcasc7 and Vcasc8 control signals, respectively, and their drains coupled to load circuits 680 and 690, respectively.

An input matching circuit 610 has one end receiving a first input RF signal (RFin1) and the other end coupled to node X. An input matching circuit 611 has one end receiving a second input RF signal (RFin2) and the other end coupled to node Y. A resistor 614 has one end coupled to node X and the other end receiving a first bias voltage (Vbias1) for gain transistors 634 and 654. A resistor 615 has one end coupled to node Y and the other end receiving a second bias voltage (Vbias2) for gain transistors 644 and 664. Input matching circuits 610 and 611 and resistors 614 and 615 may be considered as part of LNA 600 or external to LNA 600.

Linearization circuit 620 is coupled between node X and circuit ground. Linearization circuit 621 is coupled between node Y and circuit ground. Linearization circuits 620 and 621 receive a Gain Mode control signal and may be enabled or disabled based on this control signal. Linearization circuits 620 and 621 may each be implement in similar manner as linearization circuit 420x in FIG. 4B or linearization circuit 420y in FIG. 4C.

In the exemplary design shown in FIG. 6, MIMO LNA 600 is split into two LNA sections, which are coupled in parallel. A first LNA section comprises amplifier circuit 630, and a second LNA section comprises amplifier circuit 650. One or two LNA sections may be enabled depending on the desired gain and linearity.

MIMO LNA 600 may be split based on any combination of ratios for the two LNA sections. In a first exemplary design, the first LNA section may correspond to ⅔ of LNA 600, and the second LNA section may correspond to ⅓ of LNA 600. In a second exemplary design, each LNA section may correspond to ½ of LNA 600. LNA 600 may also be split based on some other combination of ratios for the two LNA sections.

MIMO LNA 600 may operate in a single-output mode or a multi-output mode at any given moment. In the single-output mode, LNA 600 receives the RFin1 or RFin2 signal comprising at least one transmitted signal (e.g., on one set of carriers) and provides one output RF signal to one load circuit 680 or 690. In the multi-output mode, LNA 600 receives the RFin1 and/or RFin2 signal comprising at least two transmitted signals (e.g., on two sets of carriers) and provides two output RF signals (e.g., one output RF signal for each set of carriers) to two load circuits 680 and 690.

MIMO LNA 600 may support multiple gain modes (e.g., a high-gain mode and a low-gain mode) in the single-output mode and/or the multi-output mode. Each gain mode may support (i) a fixed gain with fixed bias currents for the gain transistors or (ii) a variable gain with variable bias currents for the gain transistors. Linearization circuits 620 and 621 may be enabled in the low-gain mode and disabled in the high-gain mode.

In the single-output mode with high gain, both amplifier circuits 630 and 650 may be enabled. If LNA 600 receives the RFin1 signal, then gain transistors 634 and 654 may be turned ON, and either (i) cascode transistors 636 and 656 may be turned ON to provide the RFout1 signal or (ii) cascode transistors 638 and 658 may be turned ON to provide the RFout2 signal. If LNA 600 receives the RFin2 signal, then gain transistors 644 and 664 may be turned ON, and either (i) cascode transistors 646 and 666 may be turned ON to provide the RFout1 signal or (ii) cascode transistors 648 and 668 may be turned ON to provide the RFout2 signal.

In the single-output mode with low gain, either amplifier circuit 630 or 650 may be enabled. If LNA 600 receives the RFin1 signal, then either (i) gain transistor 634 and cascode transistor 636 or (ii) gain transistor 654 and cascode transistor 656 may be turned ON to provide the RFout1 signal. Alternatively, either (i) gain transistor 634 and cascode transistor 638 or (ii) gain transistor 654 and cascode transistor 658 may be turned ON to provide the RFout2 signal.

In the multi-output mode with high gain, both amplifier circuits 630 and 650 may be enabled. If LNA 600 receives the RFin1 signal, then gain transistors 634 and 654 and cascode transistors 636, 638, 656 and 658 may be turned ON to provide the RFout1 and RFout2 signals. If LNA 600 receives the RFin2 signal, then gain transistors 644 and 664 and cascode transistors 646, 648, 666 and 668 may be turned ON to provide the RFout1 and RFout2 signals. If LNA 600 receives the RFin1 and RFin2 signals, then (i) gain transistors 634 and 654 and cascode transistors 636 and 656 may be turned ON to provide the RFout1 signal and (ii) gain transistors 644 and 664 and cascode transistors 648 and 668 may be turned ON to provide the RFout2 signal. Alternatively, (i) gain transistors 634 and 654 and cascode transistors 638 and 658 may be turned ON to provide the RFout2 signal and (ii) gain transistors 644 and 664 and cascode transistors 646 and 666 may be turned ON to provide the RFout1 signal.

In the multi-output mode with low gain, either amplifier circuit 630 or 650 may be enabled. Assuming that amplifier circuit 630 is enabled, if LNA 600 receives the RFin1 signal, then gain transistor 634 and cascode transistors 636 and 638 may be turned ON to provide the RFout1 and RFout2 signals. If LNA 600 receives the RFin2 signal, then gain transistor 644 and cascode transistors 646 and 648 may be turned ON to provide the RFout1 and RFout2 signals. If LNA 600 receives the RFin1 and RFin2 signals, then (i) gain transistor 634 and cascode transistor 636 may be turned ON to provide the RFout1 signal and (ii) gain transistor 644 and cascode transistor 648 may be turned ON to provide the RFout2 signal. Alternatively, (i) gain transistor 634 and cascode transistor 638 may be turned ON to provide the RFout2 signal and (ii) gain transistor 644 and cascode transistor 646 may be turned ON to provide the RFout1 signal.

FIG. 6 shows an exemplary design of split LNA 600 with two amplifier circuits 630 and 650 for two LNA sections. In general, a split MIMO LNA may include N amplifier circuits for N LNA sections, where N may be any integer value greater than one. A split MIMO LNA may be split based on any combination of ratios for the LNA sections.

FIG. 6 also shows an exemplary design in which each amplifier circuit includes two gain transistors for two LNA inputs and four cascode transistors for two LNA inputs and two LNA outputs. In general, an amplifier circuit may include K gain transistors for K LNA inputs and up to K*M cascode transistors for K LNA inputs and M LNA outputs, where K and M may each be any integer value greater than one. A set of M cascode transistors may be coupled between each gain transistor and the M LNA outputs. K*M cascode transistors may enable an input RF signal at any LNA input to be used to generate an output RF signal at any LNA output.

A MIMO LNA may also include a configurable matching capacitor coupled between the gate and source of a gain transistor for each LNA input. For example, MIMO LNA 600 may include (i) a first configurable matching capacitor coupled between the gate and source of gain transistor 634 and (ii) a second configurable matching capacitor coupled between the gate and source of gain transistor 644. Each configurable matching capacitor may be implemented in similar manner as configurable matching capacitor 470 in FIG. 4C.

A split amplifier utilizes a combination of amplifier splitting and linearization to obtain the desired linearity in a low-gain mode. Amplifier splitting may allow one amplifier circuit to be enabled to obtain lower gain, e.g., when a large jammer is present. Linearization may improve linearity, which may be especially desirable when a large jammer is present. Amplifier splitting and linearization may be complementary to each other. For example, amplifier splitting may be more effective in improving linearity at hot IC process corners whereas linearization may be more effective in improving linearity at cold IC process corners.

Improved linearity obtained with both amplifier splitting and linearization may enable a single duplexer to be used for multiple bands (e.g., Band 12 and Band 17 in UMTS). The duplexer may pass jammers located between the multiple bands. The jammers may be handled by the improved linearity obtained with both amplifier splitting and linearization. Using one duplexer for multiple bands (or co-banding) may be desirable in order to reduce the number of input/output (I/O) ports on an IC chip, reduce the number of off-chip circuit components, reduce circuit area, and reduce the cost of a wireless device.

In an exemplary design, an apparatus (e.g., a wireless device, an IC, a circuit module, etc.) may include first and second amplifier circuits and a linearization circuit, which may be part of an amplifier (e.g., an LNA). The first amplifier circuit (e.g., amplifier circuit 430 in FIG. 4A) may be coupled to an amplifier input. The second amplifier circuit (e.g., amplifier circuit 440 in FIG. 4A) may be coupled to the amplifier input and in parallel with the first amplifier circuit. The linearization circuit (e.g., linearization circuit 420 in FIG. 4A) may also be coupled to the amplifier input. The first and second amplifier circuits may be enabled in a first mode, e.g., a high-gain mode. One of the first and second amplifier circuits may be enabled in a second mode, e.g., a low-gain mode. The linearization circuit may be enabled in the second mode and disabled in the first mode.

The first and second amplifier circuits may provide a first gain in the first/high-gain mode. The first or second amplifier circuit may provide a second gain in the low-gain mode. The second gain may be lower than the first gain. The first and second gains may each be (i) a fixed gain obtained with a fixed bias current or (ii) a variable gain obtained with a variable bias current.

In an exemplary design, the first amplifier circuit may correspond to two third of the amplifier, and the second amplifier circuit may correspond to one third of the amplifier. In another exemplary design, the first and second amplifier circuits may each correspond to one half of the amplifier. The first and second amplifier circuits may also correspond to some other combination of fractions of the amplifier.

In an exemplary design, the first and second amplifier circuits may be further coupled to an amplifier output. The first amplifier circuit (e.g., amplifier circuit 430 in FIG. 4A) may include (i) a first gain transistor (e.g., gain transistor 434) coupled to the amplifier input and (ii) a first cascode transistor (e.g., cascode transistor 436) coupled between the first gain transistor and the amplifier output. The second amplifier circuit (e.g., amplifier circuit 440) may include (i) a second gain transistor (e.g., gain transistor 444) coupled to the amplifier input and (ii) a second cascode transistor (e.g., cascode transistor 446) coupled between the second gain transistor and the amplifier output.

In another exemplary design, the first and second amplifier circuits may be part of a SIMO amplifier and may be further coupled to first and second amplifier outputs. The first amplifier circuit (e.g., amplifier circuit 530 in FIG. 5A) may include (i) a first gain transistor (e.g., gain transistor 534) coupled to the amplifier input, (ii) a first cascode transistor (e.g., cascode transistor 536) coupled between the first gain transistor and the first amplifier output, and (iii) a second cascode transistor (e.g., cascode transistor 538) coupled between the first gain transistor and the second amplifier output. The second amplifier circuit (e.g., amplifier circuit 540) may include (i) a second gain transistor (e.g., gain transistor 544) coupled to the amplifier input, (ii) a third cascode transistor (e.g., cascode transistor 546) coupled between the second gain transistor and the first amplifier output, and (iii) a fourth cascode transistor (e.g., cascode transistor 548) coupled between the second gain transistor and the second amplifier output.

In yet another exemplary design, the first and second amplifier circuits may be part of a MIMO amplifier and may be further coupled to a second amplifier input and to first and second amplifier outputs. The first amplifier circuit (e.g., amplifier circuit 630 in FIG. 6) may include (i) a first gain transistor (e.g., gain transistor 634) coupled to the amplifier input, (ii) a second gain transistor (e.g., gain transistor 644) coupled to the second amplifier input, (iii) a first cascode transistor (e.g., cascode transistor 636) coupled between the first gain transistor and the first amplifier output, and (iv) a second cascode transistor (e.g., cascode transistor 648) coupled between the second gain transistor and the second amplifier output. The second amplifier circuit (e.g., amplifier circuit 650) may include (i) a third gain transistor (e.g., gain transistor 654) coupled to the amplifier input, (ii) a fourth gain transistor (e.g., gain transistor 664) coupled to the second amplifier input, (iii) a third cascode transistor (e.g., cascode transistor 656) coupled between the third gain transistor and the first amplifier output, and (iv) a fourth cascode transistor (e.g., cascode transistor 668) coupled between the fourth gain transistor and the second amplifier output. The first and second amplifier circuits may also include additional cascode transistors coupled between the gain transistors and the amplifier outputs, e.g., as shown in FIG. 6.

In an exemplary design, the linearization circuit may include a resistor (e.g., resistor 426 in FIGS. 4B and 4C) and a switch coupled in series and between the amplifier input and circuit ground. The switch may be implemented with a transistor (e.g., transistor 424). The linearization circuit may further include a capacitor (e.g., capacitor 422) coupled in series with the resistor and the switch. The linearization circuit may further include a second switch coupled between a bias voltage and the capacitor. The second switch may be implemented with another transistor (e.g., transistor 429 in FIG. 4C) and may pre-charge the capacitor to the bias voltage when the linearization circuit is disabled and decoupled from the amplifier input. The linearization circuit may also include other circuit components.

In an exemplary design, the apparatus may further include a configurable matching capacitor coupled between a gate and a source of the first gain transistor in the first amplifier circuit. The configurable matching capacitor (e.g., configurable matching capacitor 470 in FIG. 4C) may include a capacitor and a switch. The capacitor (e.g., capacitor 474) may be used for input matching of the amplifier. The switch may be implemented with a transistor (e.g., transistor 472), may be coupled to the capacitor, and may couple or decouple the capacitor between the gate and the source of the first gain transistor. The capacitor may have an adjustable capacitance to adjust the input impedance of the amplifier.

In an exemplary design, the apparatus may further include an input matching circuit coupled to the gate of the first gain transistor in the first amplifier circuit. The input matching circuit (e.g., input matching circuit 410x in FIG. 4B) may include an inductor (e.g., inductor 412) coupled between an input and an output of the input matching circuit.

Figure 8:
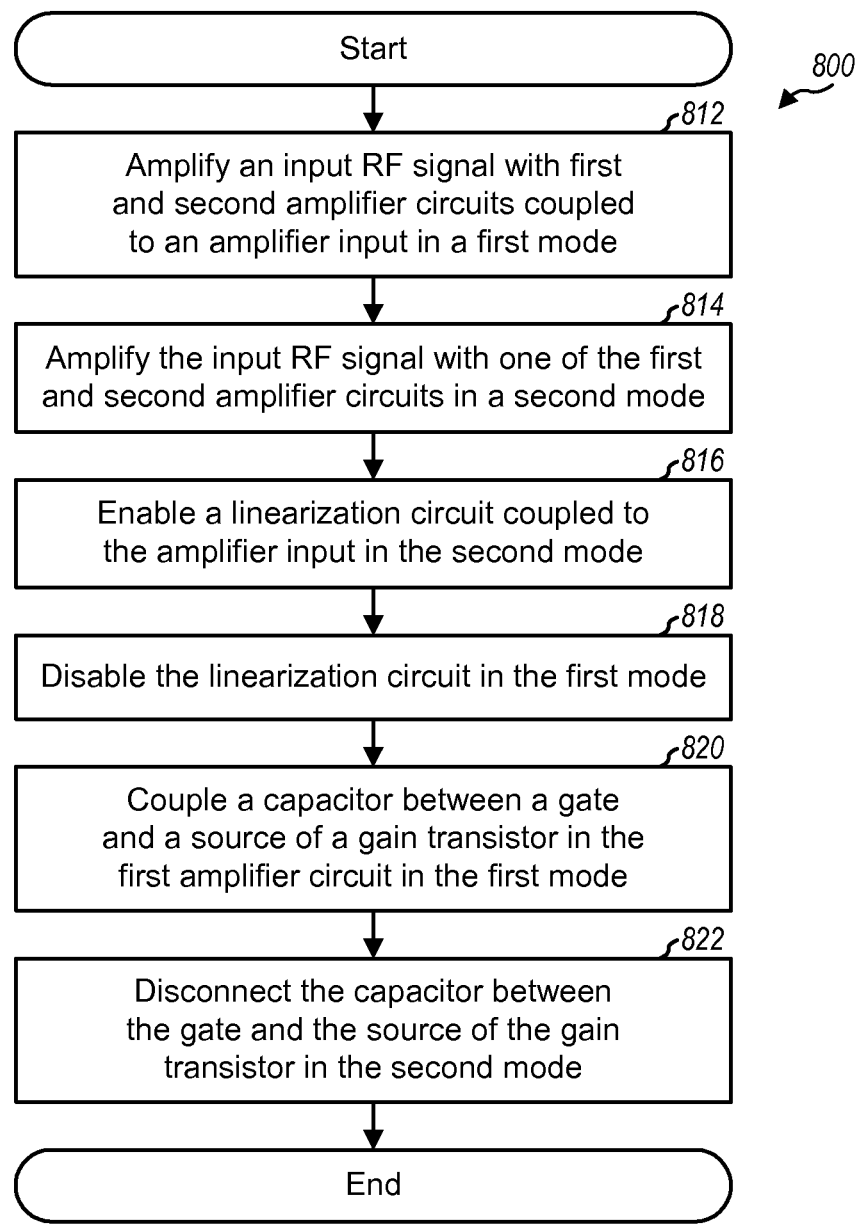
FIG. 8 shows a process for performing signal amplification.

FIG. 8 shows an exemplary design of a process 800 for performing signal amplification. An input RF signal may be amplified with first and second amplifier circuits coupled to an amplifier input in a first mode, e.g., a high-gain mode (block 812). The input RF signal may be amplified with one of the first and second amplifier circuits in a second mode, e.g., a low-gain mode (block 814). A linearization circuit may be coupled to the amplifier input and may be enabled in the second mode (block 816) and disabled in the first mode (block 818).

A capacitor may be coupled between a gate and a source of a gain transistor in the first amplifier circuit in the first mode and may be used for input matching (block 820). The capacitor may be disconnected from the gate and/or source of the gain transistor in the second mode (block 822).

In one design, an output RF signal may be generate with the first and second amplifier circuits in the first mode and with the first or second amplifier circuit in the second mode, e.g., as shown in FIG. 4A. In another design, two output RF signals may be generated with the first and second amplifier circuits in the first mode and with the first or second amplifier circuit in the second mode, e.g., as shown in FIG. 5A.

The split amplifiers described herein may be implemented on an IC, an analog IC, an RFIC, a mixed-signal IC, an ASIC, a printed circuit board (PCB), an electronic device, etc. The split amplifiers may also be fabricated with various IC process technologies such as complementary metal oxide semiconductor (CMOS), N-channel MOS (NMOS), P-channel MOS (PMOS), bipolar junction transistor (BJT), bipolar-CMOS (BiCMOS), silicon germanium (SiGe), gallium arsenide (GaAs), heterojunction bipolar transistors (HBTs), high electron mobility transistors (HEMTs), silicon-on-insulator (SOI), etc.

An apparatus implementing a split amplifier described herein may be a stand-alone device or may be part of a larger device. A device may be (i) a stand-alone IC, (ii) a set of one or more ICs that may include memory ICs for storing data and/or instructions, (iii) an RFIC such as an RF receiver (RFR) or an RF transmitter/receiver (RTR), (iv) an ASIC such as a mobile station modem (MSM), (v) a module that may be embedded within other devices, (vi) a receiver, cellular phone, wireless device, handset, or mobile unit, (vii) etc.

In one or more exemplary designs, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer-readable media.

The previous description of the disclosure is provided to enable any person skilled in the art to make or use the disclosure. Various modifications to the disclosure will be readily apparent to those skilled in the art, and the generic principles defined herein may be applied to other variations without departing from the scope of the disclosure. Thus, the disclosure is not intended to be limited to the examples and designs described herein but is to be accorded the widest scope consistent with the principles and novel features disclosed herein.

What is claimed is:

1. An apparatus comprising:
a first amplifier circuit coupled to an amplifier input;
a second amplifier circuit coupled to the amplifier input and in parallel with the first amplifier circuit; and
a linearization circuit coupled to the amplifier input, the first and second amplifier circuits being enabled in a first mode, one of the first and second amplifier circuits being enabled in a second mode, and the linearization circuit being enabled in the second mode and disabled in the first mode, wherein the linearization circuit receives a gain control signal, and wherein the linearization circuit is enabled or disabled based on the gain control signal.

2. The apparatus of claim 1,
the first amplifier circuit comprising:
a first gain transistor coupled to the amplifier input, and
a first cascode transistor coupled between the first gain transistor and an amplifier output, and
the second amplifier circuit comprising:
a second gain transistor coupled to the amplifier input, and
a second cascode transistor coupled between the second gain transistor and the amplifier output.

3. The apparatus of claim 1,
the first amplifier circuit comprising:
a first gain transistor coupled to the amplifier input,
a first cascode transistor coupled between the first gain transistor and a first amplifier output, and
a second cascode transistor coupled between the first gain transistor and a second amplifier output, and
the second amplifier circuit comprising:
a second gain transistor coupled to the amplifier input,
a third cascode transistor coupled between the second gain transistor and the first amplifier output, and
a fourth cascode transistor coupled between the second gain transistor and the second amplifier output.

4. The apparatus of claim 1,
the first amplifier circuit comprising:
a first gain transistor coupled to the amplifier input,
a second gain transistor coupled to a second amplifier input,
a first cascode transistor coupled between the first gain transistor and a first amplifier output, and a second cascode transistor coupled between the second gain transistor and a second amplifier output, and the second amplifier circuit comprising:
a third gain transistor coupled to the amplifier input,
a fourth gain transistor coupled to the second amplifier input,
a third cascode transistor coupled between the third gain transistor and the first amplifier output, and
a fourth cascode transistor coupled between the fourth gain transistor and the second amplifier output.

5. The apparatus of claim 1, the linearization circuit comprising:
a resistor and a switch coupled in series and between the amplifier input and circuit ground.

6. The apparatus of claim 5, the linearization circuit further comprising:
a capacitor coupled in series with the resistor and the switch and between the amplifier input and circuit ground.

7. The apparatus of claim 6, the linearization circuit further comprising:
a second switch coupled between a bias voltage and the capacitor and operable to pre-charge the capacitor to the bias voltage when the linearization circuit is disabled.

8. The apparatus of claim 1, the first mode corresponding to a high-gain mode and the second mode corresponding to a low-gain mode, the first and second amplifier circuits providing a first gain in the high-gain mode, the first or second amplifier circuit providing a second gain in the low-gain mode, the second gain being lower than the first gain.

9. The apparatus of claim 2, further comprising:
a configurable matching capacitor coupled between a gate and a source of the first gain transistor.

10. The apparatus of claim 9, the configurable matching capacitor comprising:
a capacitor for input matching of an amplifier comprising the first and second amplifier circuits; and
a switch coupled to the capacitor and operable to couple or decouple the capacitor between the gate and the source of the first gain transistor.

11. The apparatus of claim 10, the capacitor having an adjustable capacitance.

12. The apparatus of claim 2, further comprising:
an input matching circuit coupled to a gate of the first gain transistor.

13. The apparatus of claim 12, the input matching circuit comprising:
an inductor coupled between an input and an output of the input matching circuit.

14. The apparatus of claim 1, the first amplifier circuit corresponding to two thirds of an amplifier comprising the first and second amplifier circuits, and the second amplifier circuit corresponding to one third of the amplifier.

15. The apparatus of claim 1, the first and second amplifier circuits each corresponding to one half of an amplifier comprising the first and second amplifier circuits.

16. A method comprising:
amplifying an input radio frequency (RF) signal with first and second amplifier circuits coupled to an amplifier input in a first mode;
amplifying the input RF signal with one of the first and second amplifier circuits in a second mode;
enabling a linearization circuit coupled to the amplifier input in the second mode; and
disabling the linearization circuit in the first mode,
wherein the linearization circuit receives a gain control signal, and wherein the linearization circuit is enabled or disabled based on the gain control signal.

17. The method of claim 16, further comprising:
coupling a capacitor between a gate and a source of a gain transistor in the first amplifier circuit in the first mode; and
disconnecting the capacitor between the gate and the source of the gain transistor in the second mode.

18. The method of claim 16, further comprising:
generating first and second output RF signals with the first and second amplifier circuits in the first mode and with said one of the first and second amplifier circuits in the second mode.

19. An apparatus comprising:
first means for amplifying coupled to an amplifier input;
second means for amplifying coupled to the amplifier input and in parallel with the first means for amplifying; and
means for linearizing coupled to the amplifier input, the first and second means for amplifying being enabled in a first mode, one of the first and second means for amplifying being enabled in a second mode, and the means for linearizing being enabled in the second mode and disabled in the first mode, wherein the means for linearizing receives a gain control signal, and wherein the means for linearizing is enabled or disabled based on the gain control signal.

20. The apparatus of claim 19, further comprising:
means for capacitive matching coupled to the first means for amplifying.

* * * * *